United States Patent
Salmon et al.

(10) Patent No.: US 9,661,421 B2
(45) Date of Patent: May 23, 2017

(54) MICROPHONE PACKAGE WITH MOLDED SPACER

(71) Applicant: Robert Bosch GmbH, Stuttgart (DE)

(72) Inventors: Jay Scott Salmon, Pittsburgh, PA (US); Kuldeep Saxena, Wexford, PA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/924,789

(22) Filed: Oct. 28, 2015

(65) Prior Publication Data

US 2016/0127838 A1 May 5, 2016

Related U.S. Application Data

(60) Provisional application No. 62/069,939, filed on Oct. 29, 2014.

(51) Int. Cl.
*H04R 19/00* (2006.01)
*H04R 19/04* (2006.01)
*H04R 1/06* (2006.01)

(52) U.S. Cl.
CPC ............. *H04R 19/005* (2013.01); *H04R 1/06* (2013.01); *H04R 19/04* (2013.01); *B81B 2201/0257* (2013.01); *B81C 2203/0118* (2013.01); *H04R 2201/003* (2013.01); *H04R 2231/001* (2013.01)

(58) Field of Classification Search
CPC ........ H04R 19/005; H04R 1/06; H04R 19/04; H04R 2201/003; H04R 2231/001; B81B 2201/0257; B81C 2203/0118
See application file for complete search history.

(56) References Cited

U.S. PATENT DOCUMENTS

| | | | |
|---|---|---|---|
| 8,447,057 | B2 | 5/2013 | Goida et al. |
| 8,842,858 | B2 | 9/2014 | Lillelund |
| 8,842,859 | B2 | 9/2014 | Delaus et al. |
| 2008/0175425 | A1 | 7/2008 | Roberts et al. |
| 2009/0175479 | A1 | 7/2009 | Shirasaka |
| 2009/0243060 | A1 | 10/2009 | Saitoh |

(Continued)

FOREIGN PATENT DOCUMENTS

| | | |
|---|---|---|
| JP | 2013074151 A | 4/2013 |
| WO | 2012/143151 | 10/2012 |

(Continued)

OTHER PUBLICATIONS

International Search Report and Written Opinion for Application No. PCT/US2015/047712 dated Feb. 19, 2016 (12 pages).
Co-pending U.S. Appl. No. 14/703,233, filed May 4, 2015.

*Primary Examiner* — Neil Prasad
(74) *Attorney, Agent, or Firm* — Michael Best & Friedrich LLP

(57) ABSTRACT

A microelectromechanical system (MEMS) microphone package including a MEMS microphone die configured to sense acoustic pressure and to generate a signal based on the acoustic pressure. An application specific integrated circuit (ASIC) electrically connects to the MEMS microphone die. The MEMS microphone package includes a molded package spacer that connects to a conductive lid and to a substrate. The molded package spacer forms side walls of the MEMS microphone package and is adapted to route electrical connections from the MEMS microphone die and the ASIC to the substrate.

26 Claims, 6 Drawing Sheets

(56) References Cited

U.S. PATENT DOCUMENTS

| | | |
|---|---|---|
| 2010/0155863 A1 | 6/2010 | Weekamp |
| 2012/0087521 A1* | 4/2012 | Delaus ................ B81C 1/00238 |
| | | 381/174 |
| 2013/0050227 A1* | 2/2013 | Petersen ............... H01L 23/053 |
| | | 345/501 |
| 2013/0343590 A1 | 12/2013 | Nakagawa et al. |
| 2014/0205127 A1 | 7/2014 | Khenkin et al. |
| 2014/0254835 A1 | 9/2014 | Yakura |
| 2014/0264654 A1 | 9/2014 | Salmon |
| 2016/0234604 A1* | 8/2016 | Saxena .................. H04R 19/04 |

FOREIGN PATENT DOCUMENTS

| | | |
|---|---|---|
| WO | 2014040017 A1 | 9/2013 |
| WO | 2014/040017 | 3/2014 |
| WO | 2014/160006 | 10/2014 |

* cited by examiner

MICROPHONE PACKAGE WITH MOLDED SPACER

CROSS-REFERENCE TO RELATED CASES

This application claims the benefit of U.S. Provisional Patent Application No. 62/069,939 filed on Oct. 29, 2014, the entire contents of which are incorporated herein by reference.

BACKGROUND

The disclosure relates to Microelectromechanical System (MEMS) packaging, and more particularly, to a MEMS microphone package.

SUMMARY

A microelectromechanical system (MEMS) microphone has an acoustic chamber and an acoustic input port that lets acoustic pressure enter into the acoustic chamber. Forming the MEMS microphone package and the acoustic chamber, is a substrate, a conductive lid, and a package spacer. The MEMS microphone package is constructed in a top-port configuration. In this configuration, an acoustic input port is formed as an aperture through the conductive lid with a MEMS microphone die affixed to the conductive lid and aligned with the aperture. The package spacer is positioned between and connects the conductive lid and the substrate. The package spacer is formed from a molded material, such as plastic or ceramic, and may have a conductive lining on a bottom and/or top surface of the package spacer. The package spacer provides a pathway for electronic communication with the interior of the MEMS microphone package. The conductive lid may be constructed of a metal plate, which electrically connects to the package spacer. The metal plate provides for a low-cost material to enclose the acoustic cavity. Additionally, the metal plate provides protection to interior components of the microphone package and helps to create a durable, dent-resistant MEMS microphone package.

In one embodiment, the invention provides a microelectromechanical system (MEMS) microphone package including a MEMS microphone die configured to sense acoustic pressure and to generate an electrical signal based on the sensed acoustic pressure and an application specific integrated circuit (ASIC) electrically connected to the MEMS microphone die. The ASIC is configured to receive the electrical signal from the MEMS microphone die. The MEMS microphone package also includes a substrate with electrical connection pads, a conductive lid including an acoustic input port, and a package spacer. The package spacer has a top surface and a bottom surface. The top surface is connected to the conductive lid and the bottom surface is connected to the substrate. The package spacer is formed of a molded material.

In another embodiment, a MEMS microphone package comprises a package spacer having a cavity and a bonding shelf, a MEMS microphone, and an ASIC. The bonding shelf integrally formed as a portion of an interior of the package spacer. The MEMS and the ASIC disposed within the cavity are encapsulated by a conductive lid and a substrate. A surface formed on the bonding shelf contacts at least a portion of the substrate. The ASIC is electrically connected to the surface of the bonding shelf. The package spacer further comprises a first surface and a second surface. The first surface is positioned above the surface formed on the bonding shelf and is connected to the substrate. The second surface opposed to the first surface is connected to the conductive lid.

Other aspects of the disclosure will become apparent by consideration of the detailed description and accompanying drawings.

DETAILED DESCRIPTION

Before any embodiments of the disclosure are explained in detail, it is to be understood that the disclosure is not limited in its application to the details of construction and the arrangement of components set forth in the following description or illustrated in the following drawings. The disclosure is capable of other embodiments and of being practiced or of being carried out in various ways.

Figure 1:
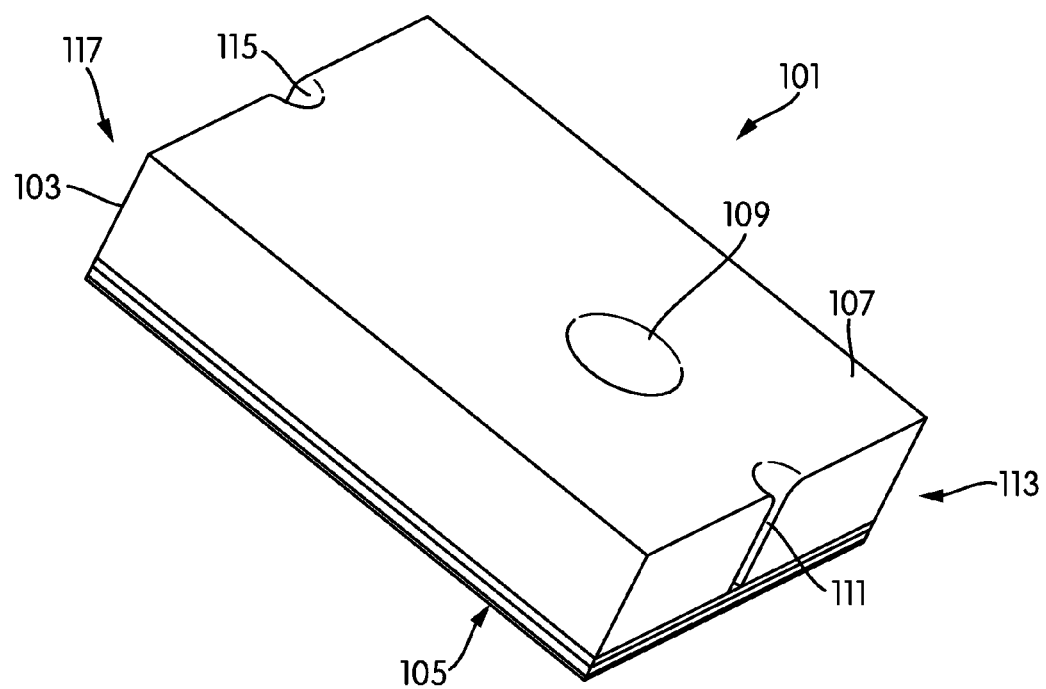
FIG. 1 is a perspective view of a MEMS microphone package according to one embodiment.

A perspective view of a MEMS microphone package 101 according to one embodiment is illustrated in FIG. 1. The MEMS microphone package 101 includes a package spacer 103, a substrate 105, and a conductive lid 107 or a conductive cap 107. The package spacer 103 forms side walls of the MEMS microphone package 101 and maintains a spacing between the substrate 105 and the conductive lid 107. The substrate 105 and the conductive lid 107 are fixed to the package spacer 103 during manufacturing of the MEMS microphone package 101. In one example, solder or epoxy may be used as a binding agent to hold the package spacer 103, the substrate 105, and the conductive lid 107 together. In this way, the package spacer 103, the substrate 105, and the conductive lid 107 protect internal electronics within the MEMS microphone package 101. For added strength, the conductive lid 107 may be formed of stamped metal. In addition, the conductive lid 107 may be substantially planar and parallel with the substrate 105. Included in the conductive lid 107 is an acoustic input port 109. The acoustic input port 109 is an aperture that allows acoustic pressure to enter the MEMS microphone package 101. The acoustic input port 109 may be formed on any location of the conductive lid 107. In one embodiment, the acoustic input port 109 may be located above internal electronics, i.e., microphone die, ASIC, or any electronic components. In another embodiment, the acoustic input port 109 may be located at a distance offset from the internal electronics. In yet another embodiment, the acoustic input port 109 may be located proximal or adjacent a corner of the conductive lid 107 without hindering the entrance of the acoustic pressure into the MEMS microphone package 101. Except for the acoustic input port 109, the MEMS microphone package 101 is sealed to form an airtight enclosure.

A conductive via 111 is positioned on a side 113 of the MEMS microphone package 101. The conductive via 111 is formed by etching, drilling, punching, or molding into the one side 113 of the package spacer 103. A conductive material (e.g., a metal coating) is deposited or otherwise formed within the conductive via 111. Alternatively, the conductive via 111 may be filled with metal. The conductive via 111 extends from the conductive lid 107 to the substrate 105. As a consequence, the conductive lid 107 is electrically connected to at least a portion of the substrate 105 by the conductive via 111. In the illustrated embodiment, a second conductive via 115 is positioned on a second side 117 of the MEMS microphone package 101. The second conductive via 115 is in most respects identical to the conductive via 111. More or less than two conductive via may be formed on the MEMS microphone package 101, depending on the application. The location of the conductive via may be formed on sides adjacent to the first side 113 and the second side 117 of the MEMS microphone package 101.

Figure 2:
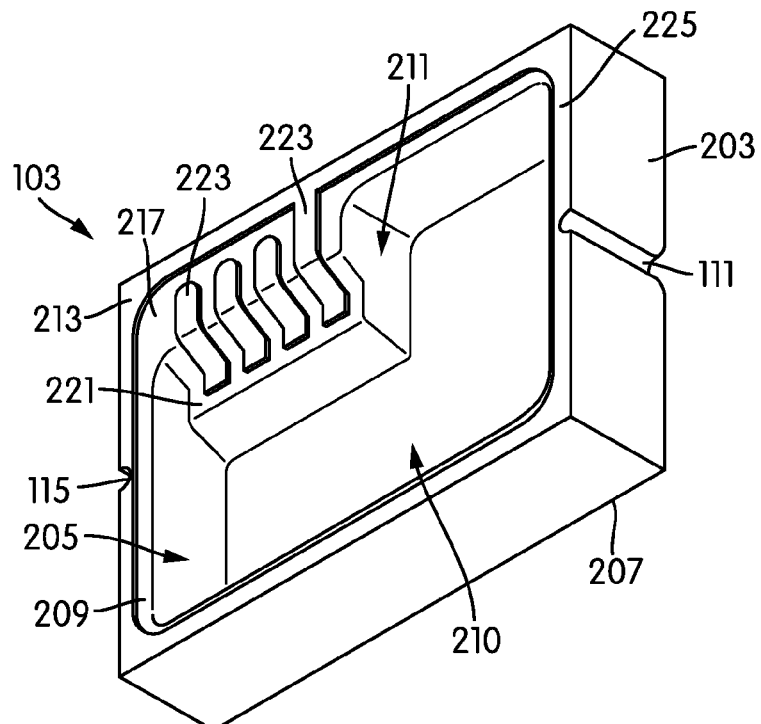
FIG. 2 is a perspective view of a package spacer of the MEMS microphone package of FIG. 1.

In FIG. 2, a perspective view of the package spacer 103 is illustrated prior to attachment of the substrate 105 and the conductive lid 107. In some embodiments, the package spacer 103 is formed by a molding process. For example, the package spacer 103 may be formed entirely of a plastic or polymer material. In other embodiments, the package spacer 103 is formed of ceramic or other non-conductive material. As a consequence, the package spacer 103 may be more rugged, less costly, and/or easier to manufacture than a MEMS microphone package 101 that is formed mostly from silicon, such as one formed from a silicon wafer. The package spacer 103 is formed such that it includes an exterior surface 203, an interior surface 205, a top surface 207, a bottom surface 209, and a cavity 210. The top surface 207 and/or the bottom surface 209 may be partially or completely coated with a conductive layer, such as, for example, a metalized film. In another embodiment, a metalized film or seed metalized layer may be formed within the package spacer 103.

In some embodiments, the package spacer 103 includes a bonding shelf 211. The bonding shelf 211 may form part of the interior surface 205 of the package spacer 103. In the illustrated embodiment, the bonding shelf 211 is positioned in a corner 213 of the package spacer 103. The bonding shelf 211 may be formed as a single monolithic component with the package spacer 103. For example, the bonding shelf 211 may be molded together with the package spacer 103 during manufacturing. Conversely, the bonding shelf 211 may be formed separately and fixed to the package spacer 103 after the molding process. The bonding shelf 211 includes a bottom surface 217 that may be flush with the bottom surface 209 of the package spacer 103. The bottom surface 217 and the bottom surface 209 may contact at least a portion of the substrate 105 when the substrate 105 is fixed to the package spacer 103. Alternatively, one of the bottom surface 217 and the bottom surface 209 may contact at least a portion of the substrate 105 when the substrate 105 is fixed to the package spacer 103. The bonding shelf 211 also includes a wire bonding surface 221. The wire bonding surface 221 provides a location for electrical connections within the MEMS microphone package 101. The bonding shelf 211 may form an S-curve that extends from the bottom surface 217 to the wire bonding surface 221. The wire bonding surface 221 may be parallel to the bottom surface 217. Depending on the application, more than one bonding shelf 211 may be formed in the package spacer 103.

The bonding shelf 211 also includes conductive traces 223 that extend from the bottom surface 217 of the bonding shelf 211 to the wire bonding surface 221. The conductive traces 223 may be formed by depositing a conductive material, such as, for example, a metal film, onto the bonding shelf 211. The conductive traces 223, at one end, are electrically connected to a portion of the substrate 105 and, at the other end, terminate at the wire bonding surface 221. As a consequence, the conductive traces 223 provide electrical pathways between the interior of the MEMS microphone package 101 and the substrate 105. For example, the conductive traces 223 provide one or more ground lines, power lines, and signal lines that allow power and ground voltages to be supplied from the substrate 105 and allow signals to be carried to the substrate 105. Therefore, the package spacer 103 provides for electrical connections between the substrate 105 and the internal components of the MEMS microphone package 101. The package spacer 103 also may include a seal ring 225 that extends around a perimeter of the top surface 207 of the package spacer 103.

Figure 3:
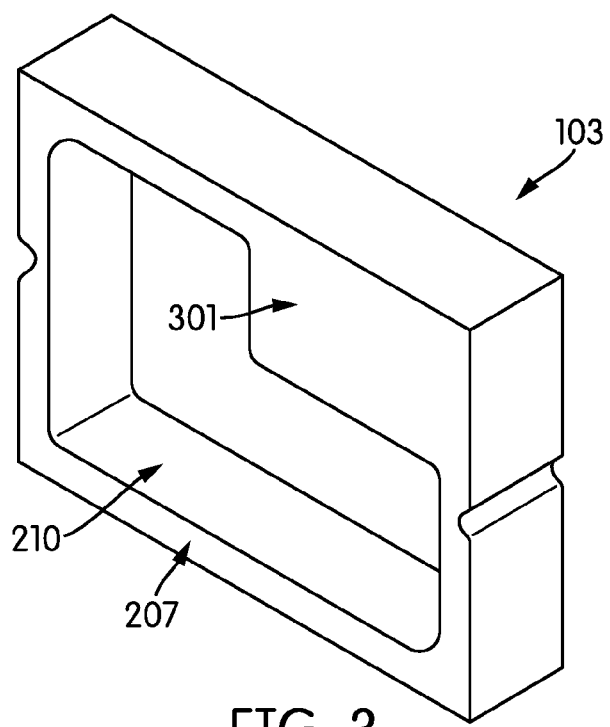
FIG. 3 is an opposite-side perspective view of the package spacer of FIG. 2.

In the embodiment illustrated in FIG. 3, the package spacer 103 includes a top surface 207. The top surface 207 may be flush with a top surface 301 of the bonding shelf 211. The top surface 207 contacts the conductive lid 107 when the conductive lid 107 is fixed to the package spacer 103 thereby providing electrical conductivity between the conductive lid 107, the conductive via 111, and the conductive via 115. The conductive lid 107 may also electrically connect to the interior surface 205 or the exterior surface 203 of the package spacer 103. As a consequence, the conductive lid 107, the conductive via 111, and the conductive via 115 form an electromagnetic shield for the internal components in the MEMS microphone package 101.

Figure 4:
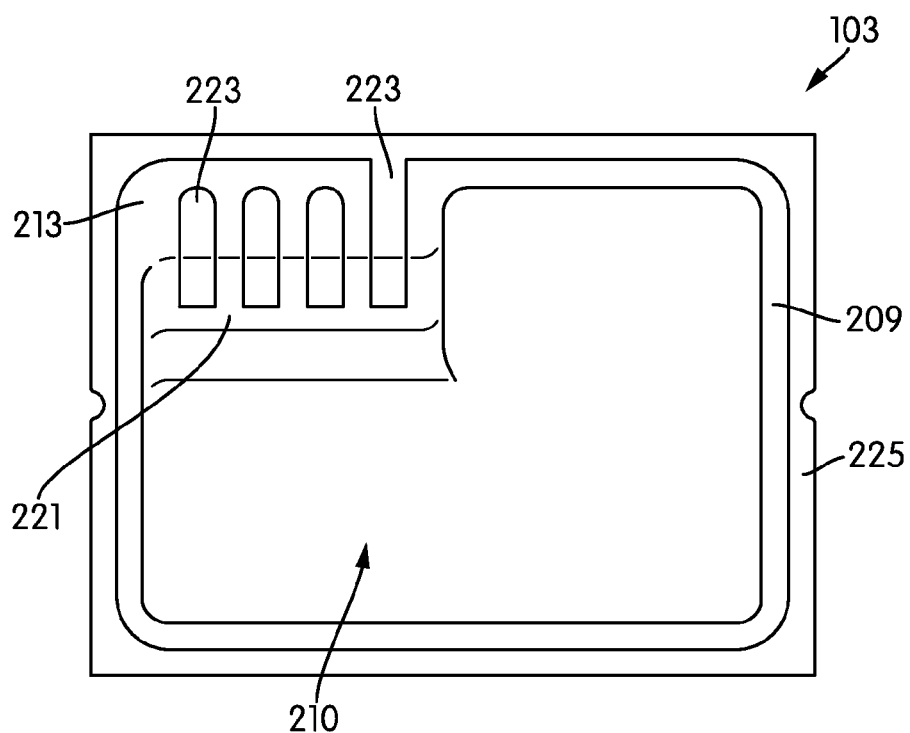
FIG. 4 is a bottom view of the package spacer of FIG. 2.
Figure 5:
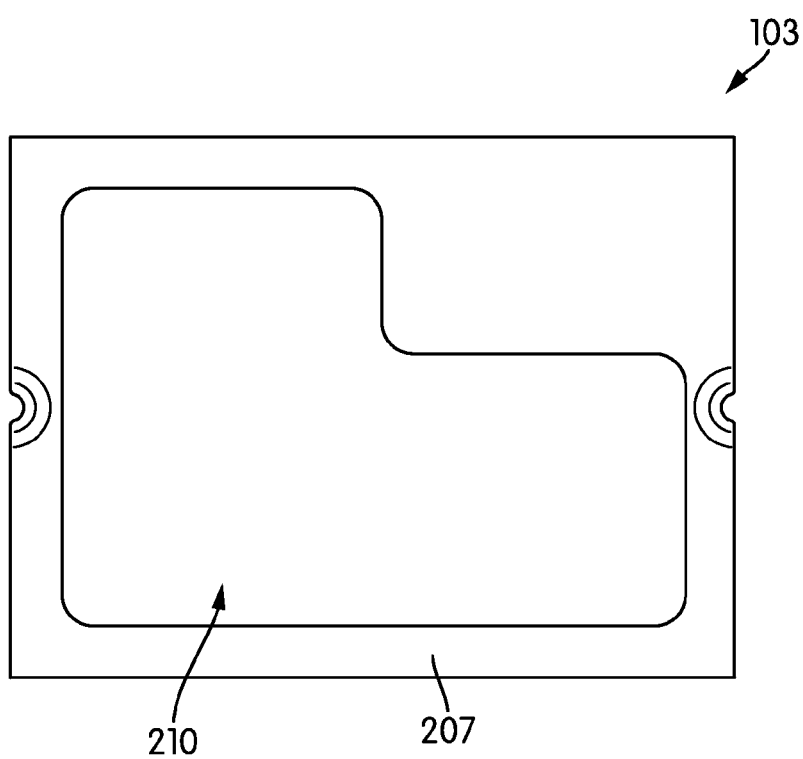
FIG. 5 is a top view of the package spacer of FIG. 2.

FIG. 4 illustrates a bottom view (i.e., from the substrate side) of the package spacer 103. This view illustrates that the bottom surface 209 of the package spacer 103 extends around the perimeter of the package spacer 103. The seal ring 225 may be formed as a metalization layer (i.e., a metal deposit) on top of the bottom surface 209 of the package spacer 103. The seal ring 225 provides a physical and electrical connection point with the substrate 105. For example, the seal ring 225 may be attached to the substrate 105 with solder. Alternatively, the bottom surface 209 of the package spacer 103 may be attached to the package spacer 103 with epoxy. In yet another embodiment, the bottom surface 209 of the package spacer 103 may be attached to the package spacer 103 with microbumps or solder microbumps under bump metallurgy pads (UBM). FIG. 5 illustrates an opposite view of FIG. 4 with the top surface 207 illustrated. As previously described, the top surface 207 provides a surface for physical and electrical connection with the conductive lid 107.

Figure 6:
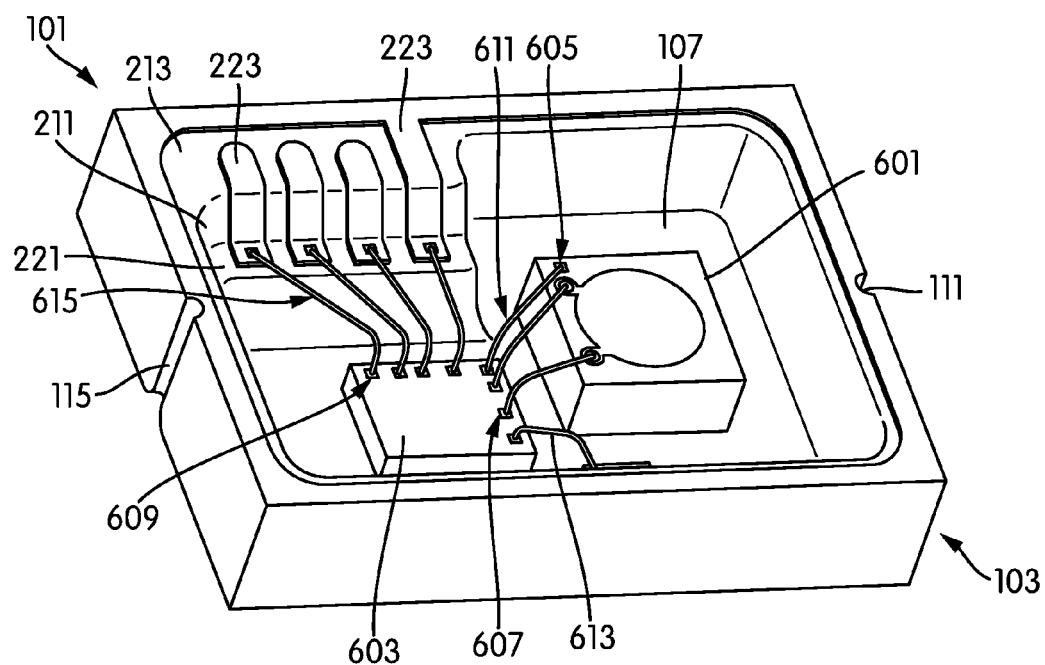
FIG. 6 is a perspective view of the MEMS microphone package of FIG. 1 prior to attachment of a substrate to the package spacer.

FIG. 6 illustrates the MEMS microphone package 101 without the substrate 105 to illustrate electronic components within the acoustic cavity. As such, FIG. 6 illustrates the internal configuration of the MEMS microphone package 101. The MEMS microphone package 101 includes a MEMS microphone die 601 and an application specific integrated circuit (ASIC) 603. Optionally, a second sensing die such as an inertial sensor, a chemical sensor, and the like may be mounted within the MEMS microphone package 101. Depending on the application, the ASIC 603 may not be included in the MEMS microphone package 101. The MEMS microphone die 601 and the ASIC 603 may be affixed or mounted directly to the conductive lid 107. The MEMS microphone die 601 includes bonding pads 605 configured to receive wired connections. Similarly, the ASIC 603 includes a first set of bonding pads 607 configured to receive wired connections from the MEMS microphone die 601 and a second set of bonding pads 609 configured to receive wired connections from the wire bonding surface 221. A first set of wires 611 are connected between the bonding pads 605 of the MEMS microphone die 601 and the first set of bonding pads 607 of the ASIC 603. A ground wire 613 connects the ASIC 603 to the conductive lid 107. A second set of wires 615 are connected between the second set of bonding pads 609 of the ASIC 603 and the conductive traces 223 on the wire bonding surface 221. In this way, a plurality of wires interconnect the interior electronic components and electrical traces within the MEMS microphone package 101.

When acoustic pressure enters into the MEMS microphone package 101 through the acoustic input port 109, the acoustic pressure impinges on a diaphragm (not shown) of the MEMS microphone die 601. The MEMS microphone die 601 senses the acoustic pressure via the diaphragm and generates an electrical signal based on the acoustic pressure. The ASIC 603 receives the electrical signal via the first set of wires 611 and generates another electrical signal representative of the acoustic pressure received by the MEMS microphone die 601. The ASIC 603 sends the electrical signal via the second set of wires 615 and the electrical traces 223 to the substrate 105 where the electrical signal is further processed and amplified.

Figure 7:
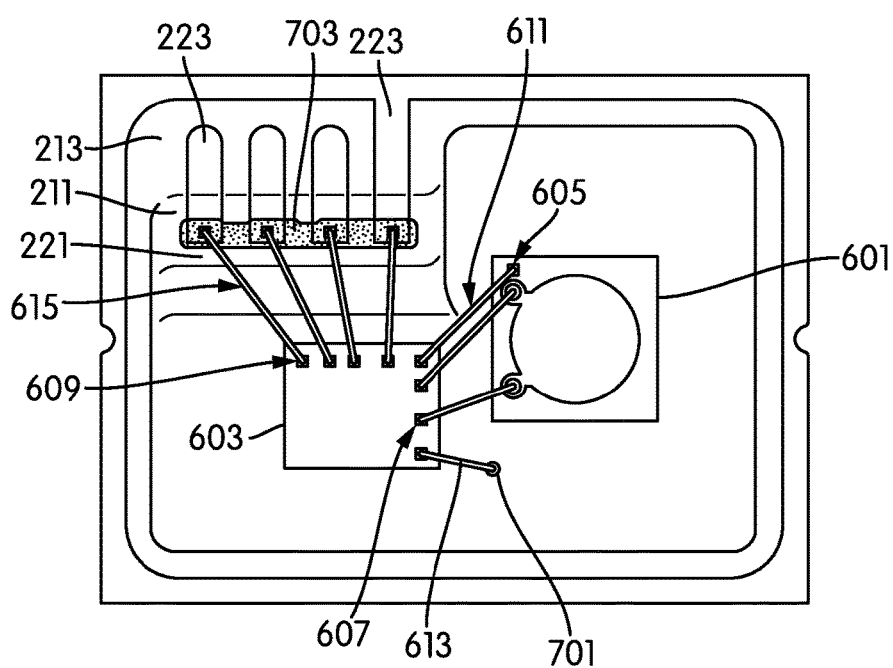
FIG. 7 is a bottom view of the MEMS microphone package of FIG. 6.

FIG. 7 is a bottom view (i.e., from the substrate side) of the MEMS microphone package 101 illustrated in FIG. 6. As illustrated in FIG. 7, the ground wire 613 is connected to an arbitrary point 701 on the conductive lid 107. The MEMS microphone package 101 may also include an epoxy seal 703 to protect soldered electrical bonds at the connection point of the conductive traces 223 and the second set of wires 615 on the wire bonding surface 221.

Figure 8:
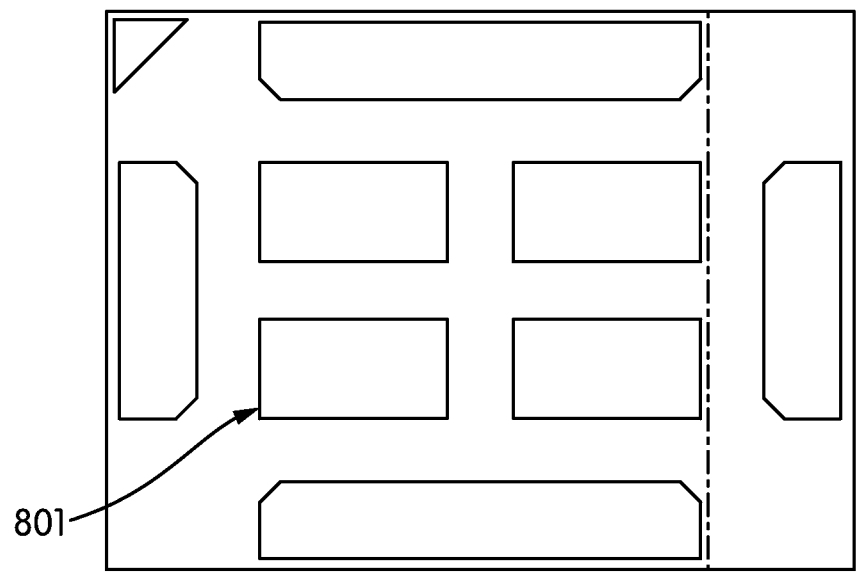
FIG. 8 is a bottom view of an external side of the substrate of the MEMS microphone package of FIG. 1.
Figure 9:
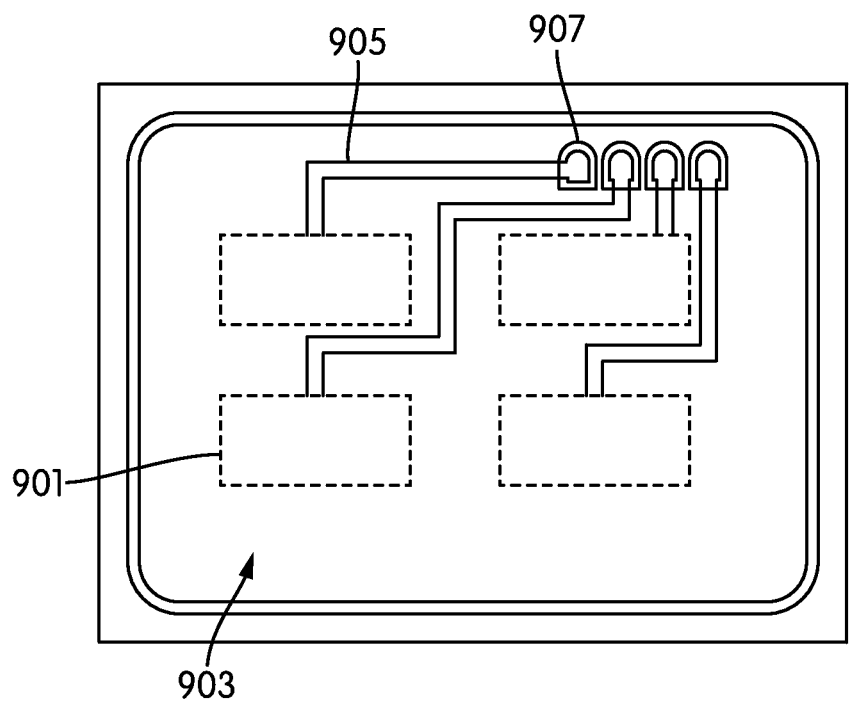
FIG. 9 is a top view of an interior side of the substrate of the MEMS microphone package of FIG. 1.

FIG. 8 is a bottom view of the substrate 105. The substrate 105 may include electrical traces, electrical vias, and electrical components that provide connections to and support for the internal electrical components of the MEMS microphone package 101. For example, the substrate 105 may include external connection pads 801. The external connection pads 801 are connected to electrical vias (not shown) that form a conductive path through the substrate 105. As illustrated in FIG. 9, the electrical vias connect to substrate connection points 901 on an interior surface 903 of the substrate 105. The substrate connection points 901 are connected to substrate traces 905, which connect to package spacer connection pads 907. The package spacer connection pads 907 connect to the conductive traces 223 when the MEMS microphone package 101 is assembled. It should be noted that the substrate 105 may contain various types and configurations of electrical pathways and connections for the internal components of the MEMS microphone package 101.

Thus, the disclosure provides, among other things, a microelectromechanical system (MEMS) microphone package including a conductive lid with an acoustic input port and a molded spacer adapted to connect the conductive lid to a substrate. Various features and advantages of the disclosure are set forth in the following claims.

What is claimed is:

1. A microelectromechanical system (MEMS) microphone package comprising:
a MEMS microphone die configured to sense acoustic pressure and to generate an electrical signal based on the sensed acoustic pressure;
an application specific integrated circuit (ASIC) electrically connected to the MEMS microphone die, the ASIC configured to receive the electrical signal from the MEMS microphone die;
a substrate including electrical connection pads;
a conductive lid including an acoustic input port; and
a package spacer having a top surface and a bottom surface, the top surface connected to the conductive lid and the bottom surface secured to the substrate, the package spacer formed of a molded material.

2. The MEMS microphone package of claim 1, further comprising a bonding shelf formed with the package spacer as a monolithic component and positioned in an interior of the package spacer, the bonding shelf including a wire bonding surface.

3. The MEMS microphone package of claim 2, wherein a plurality of wires are electrically connected between the wire bonding surface and the ASIC.

4. The MEMS microphone package of claim 2, further comprising a plurality of electrical traces that extend from the bottom surface of the package spacer to the wire bonding surface, at least one of the electrical traces electrically connected to the substrate via at least one of the electrical connection pads.

5. The MEMS microphone package of claim 4, wherein the electrical traces are deposited on the bonding shelf.

6. The MEMS microphone package of claim 4, further comprising a seal ring positioned along a perimeter of the bottom surface of the package spacer, wherein at least another one of the electrical traces is electrically connected to the seal ring.

7. The MEMS microphone package of claim 1, wherein the package spacer includes a top surface that is coated with a conductive material.

8. The MEMS microphone package of claim 2, wherein the bonding shelf includes a bottom surface that is flush with the bottom surface of the package spacer such that the bottom surface of the bonding shelf contacts the substrate.

9. The MEMS microphone package of claim 2, wherein the bonding shelf includes a top surface that is flush with the top surface of the package spacer such that the top surface of the bonding shelf contacts the conductive lid.

10. The MEMS microphone package of claim 1, wherein the package spacer is positioned between the substrate and the conductive lid, the spacer maintaining a spacing between the substrate and the conductive lid and forming side walls of the MEMS microphone package.

11. The MEMS microphone package of claim 1, wherein the molded material is ceramic.

12. The MEMS microphone package of claim 1, wherein the molded material is plastic.

13. The MEMS microphone package of claim 1, wherein the package spacer includes at least one conductive via electrically connecting the substrate and the conductive lid.

14. The MEMS microphone package of claim 13, wherein the at least one conductive via is formed on an exterior surface of the package spacer.

15. The MEMS microphone package of claim 14, wherein the at least one conductive via is a ground path for the MEMS microphone die and the ASIC.

16. The MEMS microphone package of claim 1, further comprising a wire that electrically connects the ASIC to the conductive lid.

17. The MEMS microphone package of claim 1, wherein the ASIC and the MEMS microphone die are affixed to the conductive lid.

18. The MEMS microphone package of claim 1, wherein the conductive lid is a stamped, substantially planer metal lid.

19. The MEMS microphone package of claim 1, wherein the package spacer provides external electrical connections to the MEMS microphone package including an electrical connection for a signal line and an electrical connection for a ground line.

20. A microelectromechanical system (MEMS) microphone package comprising:
- a first die configured to sense acoustic pressure and to generate an electrical signal based on the sensed acoustic pressure;
- a second die electrically connected to the first die, the second die configured to receive the electrical signal from the first die; and
- a package spacer having a cavity and a bonding shelf, the bonding shelf formed with the package spacer as a monolithic component and positioned within an interior of the package spacer, wherein the first die and the second die are disposed within the cavity, and
- wherein the second die is electrically connected to the bonding shelf.

21. The MEMS microphone package of claim 20, further comprising a substrate.

22. The MEMS microphone package of claim 21, wherein the bonding shelf includes a surface contacted with at least a portion of the substrate.

23. The MEMS microphone package of claim 22, further comprising a conductive lid connected to the package spacer.

24. The MEMS microphone package of claim 23, wherein at least one from the group consisting of the first die and the second die is attached to the conductive lid.

25. The MEMS microphone package of claim 23, wherein the package spacer includes a first surface and a second surface, wherein the first surface is positioned above the surface of the bonding shelf and connected to the substrate and wherein the second surface is opposed to the first surface and is connected to the conductive lid.

26. The MEMS microphone package of claim 25, wherein at least one from the group consisting of the first die and the second die is attached to the conductive lid.

* * * * *